(12) United States Patent
Shu et al.

(10) Patent No.: US 9,312,434 B1
(45) Date of Patent: Apr. 12, 2016

(54) LIGHT-EMITTING DIODE FABRICATION METHOD

(71) Applicant: TIANJIN SANAN OPTOELECTRONICS CO., LTD., Tianjin (CN)

(72) Inventors: Li-Ming Shu, Tianjin (CN); Xiao-Feng Liu, Tianjin (CN); Dong-Yan Zhang, Tianjin (CN); Ming-Ying Liu, Tianjin (CN); Liang-Jun Wang, Tianjin (CN); Du-Xiang Wang, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 0 days.

(21) Appl. No.: 14/750,351

(22) Filed: Jun. 25, 2015

(30) Foreign Application Priority Data

Dec. 12, 2014 (CN) .......................... 2014 1 0763110

(51) Int. Cl.

| H01L 33/46 | (2010.01) |
|---|---|
| H01L 21/00 | (2006.01) |
| H01L 33/06 | (2010.01) |
| H01L 33/00 | (2010.01) |
| H01L 33/32 | (2010.01) |
| H01L 33/14 | (2010.01) |
| H01L 33/24 | (2010.01) |
| H01L 33/30 | (2010.01) |
| H01L 33/02 | (2010.01) |
| H01L 33/22 | (2010.01) |
| H01L 33/12 | (2010.01) |

(52) U.S. Cl.
CPC ............ *H01L 33/06* (2013.01); *H01L 33/0075* (2013.01); *H01L 33/025* (2013.01); *H01L 33/12* (2013.01); *H01L 33/145* (2013.01); *H01L 33/22* (2013.01); *H01L 33/24* (2013.01); *H01L 33/30* (2013.01); *H01L 33/32* (2013.01)

(58) Field of Classification Search
None
See application file for complete search history.

(56) References Cited

U.S. PATENT DOCUMENTS

| 2009/0206359 | A1* | 8/2009 | Nabekura | ............... | H01L 33/20 257/103 |
|---|---|---|---|---|---|
| 2012/0132951 | A1* | 5/2012 | Son | ....................... | H01L 33/007 257/99 |
| 2013/0105761 | A1* | 5/2013 | Lim | ...................... | H01L 33/007 257/13 |
| 2015/0034963 | A1* | 2/2015 | Kinouchi | ............... | H01L 33/20 257/76 |
| 2015/0295138 | A1* | 10/2015 | Chae | ..................... | H01L 33/405 257/98 |

* cited by examiner

*Primary Examiner* — Minh-Loan Tran
(74) *Attorney, Agent, or Firm* — Syncoda LLC; Feng Ma; Junjie Feng

(57) ABSTRACT

A LED fabrication method includes: providing a substrate; forming a low-temperature $Al_xGa_{1-x}N$ ($0 \leq x \leq 1$) layer over the growth substrate; setting the growth pressure from high to low and temperature and rotation rate from low to high to realize change from three-dimensional growth to two-dimensional growth of the GaN structure layer before growth of the multiple quantum-well layer, in which, Si is doped at position approximate to the multiple quantum-well layer to form an undoped gradient GaN layer and an N-type gradient GaN layer; growing a multiple quantum-well layer, an $Al_xGa_{1-x}N$ ($0 \leq x \leq 1$) layer and a P-type layer; and during later chip fabrication, dividing the epitaxial wafer over the etched N-type platform into chip grains and immersing them in chemical solutions for wet etching; and forming an inverted pyramid structure with rough side wall over the multiple quantum-well layer to improve light-emitting efficiency.

20 Claims, 3 Drawing Sheets

LIGHT-EMITTING DIODE FABRICATION METHOD

CROSS-REFERENCE TO RELATED APPLICATIONS

The present application is a continuation of and claims priority to Chinese Patent Application No. CN 201410763110.3 filed on Dec. 12, 2014, the disclosure of which is hereby incorporated by reference in its entirety.

BACKGROUND

Light-emitting diode (LED) is a semiconductor light-emitting device, taking semiconductor P—N junction as the light-emitting structure. Currently, gallium nitride (GaN) is regarded as the third-generation semiconductor material. However, due to large refractive index difference between the GaN material and air, light-emitting efficiency of the light-emitting diode is much restricted for a significant part of light, when emitted from the semiconductor layer to the air, is completely reflected back due to light-emitting angle and passes through the internal part of the semiconductor, which losses part of energy that finally transfers into heat, thus imposing heat dissipation burden for the light-emitting diode. Surface roughening, as a technology for improving light-emitting efficiency of the light-emitting diode, has complex process and high cost; existing roughening surface is concentrated over the chip grain surface; and the improved side roughening is not sufficient to improve light-emitting efficiency due to small light-emitting area at side.

SUMMARY

To solve the problems above, the present disclosure provides a fabrication method of light-emitting diode, and the main technical scheme is that: 1) take heat treatment for the substrate with hydrogen or with mixed gas of hydrogen, nitrogen and ammonia gas. 2) grow a low-temperature $Al_xGa_{1-x}N$ ($0 \leq x \leq 1$) buffer layer, an undoped gradient GaN layer, an N-type gradient GaN layer, a multiple quantum-well layer, an $Al_xGa_{1-x}N$ ($0 \leq x \leq 1$) electron blocking layer and a P-type layer over the substrate after heat treatment. After growth of the buffer layer, set the growth pressure from high to low and temperature and rotation rate from low to high to realize change from three-dimensional growth to two-dimensional growth of the GaN structure layer and Si is doped at position approximate to the multiple quantum-well layer to form an undoped gradient GaN layer and an N-type gradient GaN layer with gradient growth mode; during later chip fabrication, divide the epitaxial wafer over the etched N-type platform into chip grains and immerse them in chemical solutions for wet etching; and form an inverted pyramid structure with rough side wall over the multiple quantum-well layer to improve light-emitting efficiency.

Further, during from-bottom-to-up growth of the GaN structure layer, pressure in the reaction chamber is changed from high to low, preferably, from 500 torr to 100 torr and temperature and rotation rate from low to high, preferably, from 700° C. to 1150° C. and from 600 rpm to 1200 rpm respectively.

Further, during from-bottom-to-up growth of the GaN structure layer, all or any one or two of pressure, rotation rate and temperature appear(s) liner or non-linear gradual change.

Further, during from-bottom-to-up growth of the GaN structure layer, Si is doped at position approximate to the multiple quantum-well layer to form an N-type gradient GaN layer, in which, thicknesses of the undoped gradient GaN layer and the N-type gradient GaN layer are a and b respectively, and total thickness of the GaN layer from three-dimensional growth to two-dimensional growth is c, wherein: $0 \leq a \leq c$, $0 \leq b \leq c$, and $a+b=c$.

Further, during from-bottom-to-up growth of the GaN structure layer and from three-dimensional growth to two-dimensional growth, based on product requirements, some GaN layers can be replaced by $Al_xGa_{1-x}N$ ($0 \leq x \leq 1$) or $Al_xIn_yGa_{1-x-y}N$ ($0 \leq x \leq 1$, $0 \leq y \leq 1$).

Further, during chip fabrication, the GaN structure layer has an inclined side with inclination angle of 0°-80°, preferably, 30°.

Further, the epitaxial growth method is expanded to the multiple quantum-well layer or/and the P-type layer.

Further, fabricate an N electrode and a P electrode over the inverted pyramid structure chip and cover the passivating protective layer, and then, take thinning, breaking, testing and sorting for the chip.

A fabrication method of light-emitting diode structure in the present disclosure is provided. During from-bottom-to-up growth of the GaN structure layer, set the growth pressure from high to low and temperature and rotation rate from low to high to realize change from three-dimensional growth to two-dimensional growth of the GaN structure layer before growth of the multiple quantum-well layer by changing critical layer thickness over the substrate surface and lateral and vertical growth rate, in which, Si is doped at position approximate to the multiple quantum-well layer to form an undoped gradient GaN layer and an N-type gradient GaN layer; during later chip fabrication, divide the epitaxial wafer over the etched N-type platform into chip grains and immerse them in chemical solutions for wet etching; and form an inverted pyramid structure with rough side wall over the GaN structure layer to improve light-emitting efficiency.

The present disclosure is highly operable and has high commercial value for an inverted pyramid structure with rough side wall is formed under same chip process conditions to greatly improve light-emitting efficiency by changing growth mode of the epitaxial layer, without adding epitaxy and chip fabrication step and device.

1: substrate; 2: low-temperature $Al_xGa_{1-x}N$ ($0 \leq x \leq 1$) buffer layer; 3: gradient GaN layer, in which, 3-1 is an undoped gradient GaN layer and 3-2 is an N-type gradient GaN layer; 4: multiple quantum-well layer; 5: $Al_xGa_{1-x}N$ electron blocking layer; 6: P-type layer; 7: P electrode; 8: N electrode.

DETAILED DESCRIPTION

Embodiment 1

Figure 1:
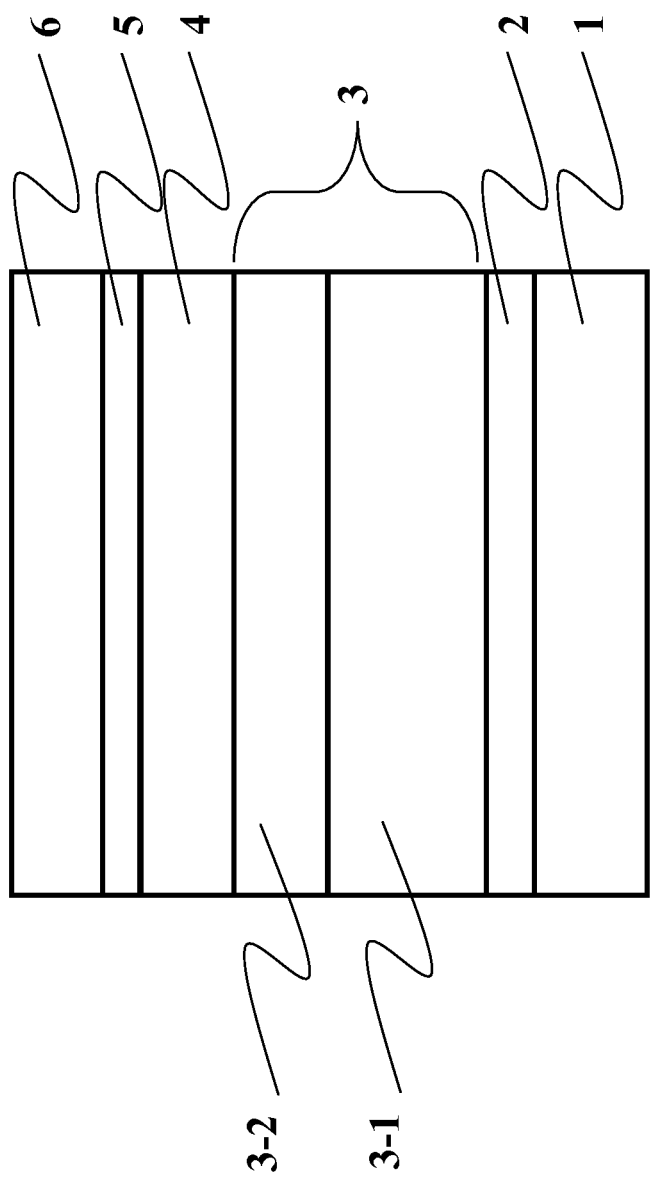
FIG. 1 is a schematic diagram of the epitaxial wafer structure of light-emitting diode according to Embodiment 1 of the present disclosure.

FIG. 1 is a schematic diagram of the epitaxial wafer structure of light-emitting diode. Fabrication process of this embodiment comprises, from bottom to up: (1) providing a sapphire substrate 1; (2) growing a low-temperature $Al_xGa_{1-x}N$ buffer layer 2, made of GaN, AlN, AlGaN or their combination with film thickness of 10-100 nm; (3) growing a gradient GaN structure layer 3 with initial growth pressure, temperature and rotation rate of 600 torr, 700° C. and 600 rpm; (4) pressure, temperature and rotation rate are changed to 100 torr, 1150° C. and 1200 rpm respectively with linear gradient, and growth thickness is controlled within 2000-10000 nm, and preferably 5000 nm; (5) during growth of the gradient GaN structure layer, doping Si at the position approximate to the multiple quantum-well layer to form an N-type gradient GaN layer 3-2, different from the undoped gradient GaN layer 3-1 with Si-doping concentration of $5 \times 10^{18}$-$5 \times 10^{19}$ cm$^{-3}$ and preferably $1.4 \times 10^{19}$ cm$^{-3}$; thicknesses of the undoped gradient GaN layer and the N-type gradient GaN layer are set as a and b respectively, and total growth thickness of the GaN layer from three-dimensional growth to two-dimensional growth is c, wherein: c=a+b; (6) growing a multiple quantum-well layer 4, with InGaN as the well layer and GaN or AlGaN or their combination as the cladding layer, in which, the cladding layer is about 50-150 nm thick and the well layer is about 1-20 nm thick and a plurality of cycle structures are formed to form an active region; (7) forming an $Al_xGa_{1-x}N$ electron blocking layer 5 with film thickness of 0.1-200 nm; (8) forming a P-type layer 6, either P-type GaN layer or P-type $In_yGa_{1-y}N$ layer, preferably P-type GaN with film thickness of 20-2000 nm, and preferably 200 nm.

Figure 2:
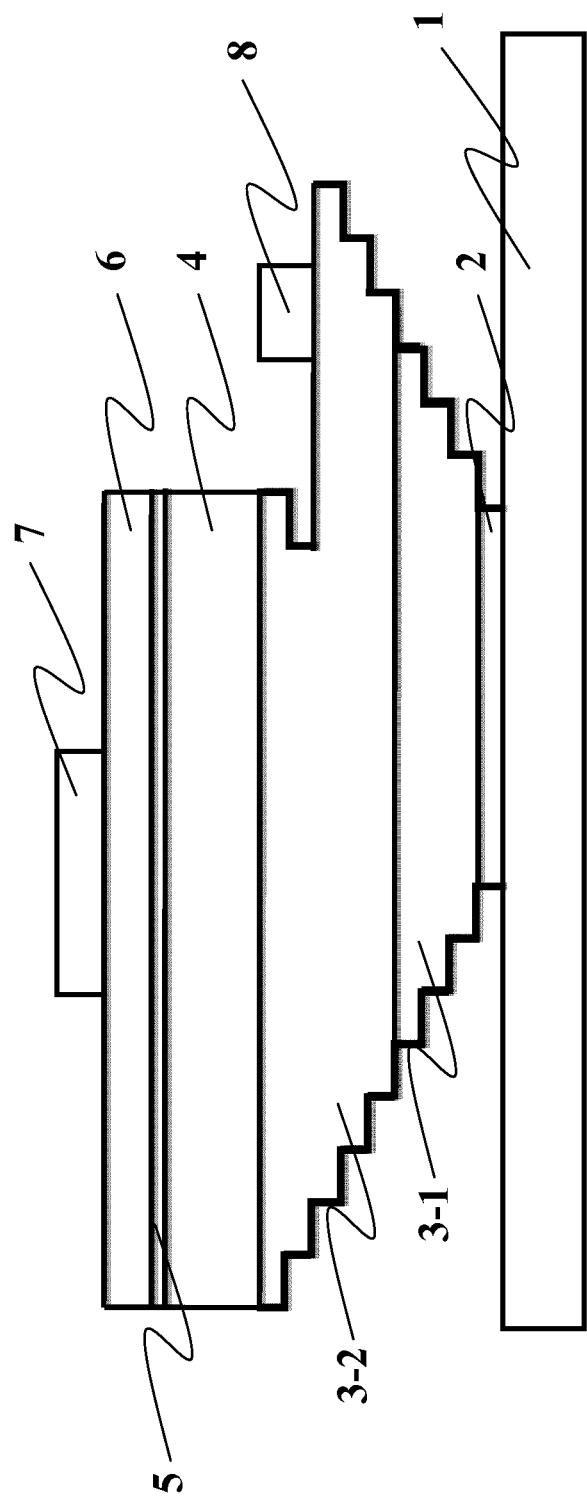
FIG. 2 is a schematic diagram of the chip structure of light-emitting diode according to Embodiment 1 of the present disclosure.

FIG. 2 is a schematic diagram of the LED chip structure according to the present disclosure. Based on the epitaxial wafer structure as shown in FIG. 1, in this embodiment: (1) forming an N electrode platform through photoetching or dry etching; (2) depositing a passivating protective layer over the epitaxial wafer surface; (3) forming chip grain through laser scribing to the extent that scribing depth is at least throughout the entire epitaxial layer to the substrate layer; (4) immersing the epitaxial wafer after laser positive scribing in the acidic chemical etching liquid for wet etching; (5) removing the passivating protective layer and fabricating an transparent conducting layer, an N electrode and a P electrode; and (6) taking thinning, breaking, testing and sorting for the chip.

As a specific embodiment of the present disclosure, during from-bottom-to-up growth of the GaN structure layer, chamber reaction pressure is changed from 600 torr to 100 torr, and temperature and rotation rate from 700° C. to 1150° C. and from 600 rpm to 1200 rpm respectively to realize change from three-dimensional growth to two-dimensional growth of the GaN structure layer by changing critical layer thickness over the substrate surface and lateral and vertical growth rate During later chip fabrication, divide the epitaxial wafer over the etched N-type platform into chip grains and immerse them in chemical solutions for wet etching; and form an inverted pyramid structure with rough side wall over the GaN structure layer. And the GaN structure layer fabricated has an inclined side with inclination angle of 0°-80°, preferably, 30°. The present disclosure is highly operable and has high commercial value for it greatly improves light-emitting efficiency by changing growth mode of the epitaxial layer, without adding epitaxy and chip fabrication step and device.

Embodiment 2

Figure 3:
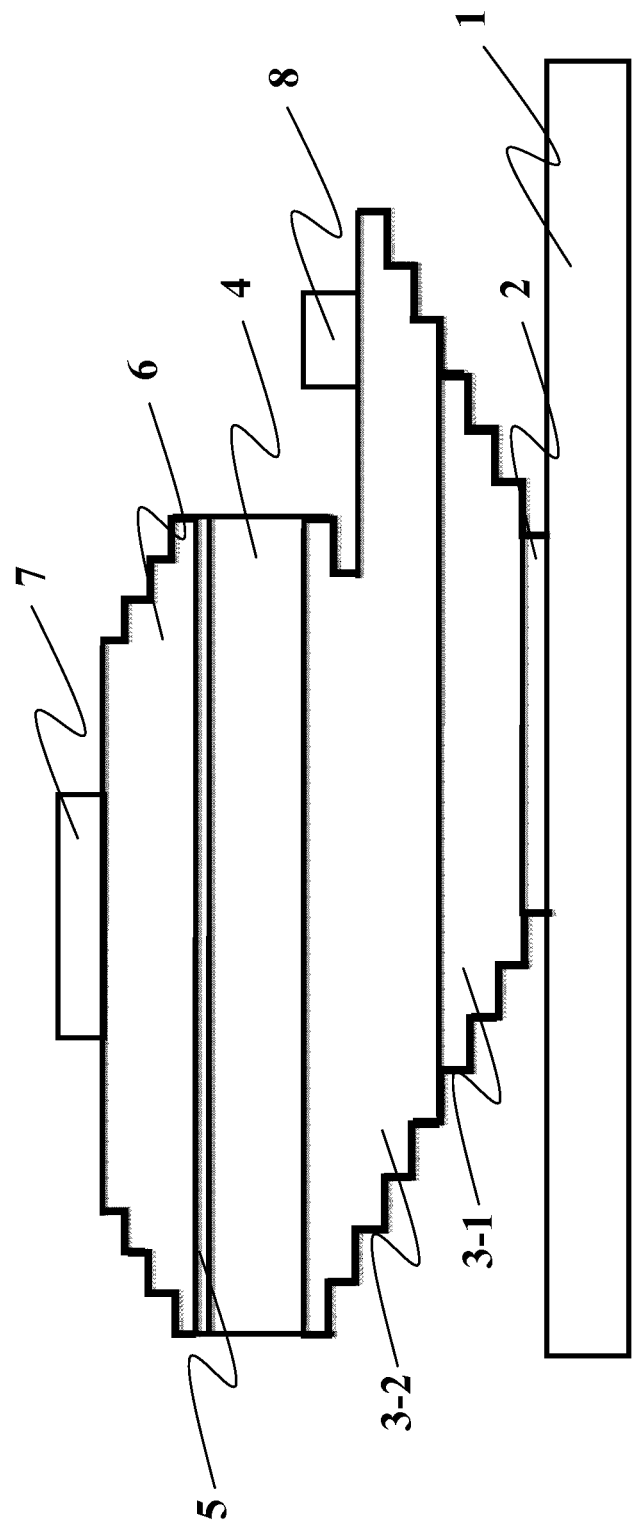
FIG. 3 is a schematic diagram of the chip structure of light-emitting diode according to Embodiment 2 of the present disclosure.

As shown in FIG. 3, different from Embodiment 1, in this embodiment, during growth of the P-type layer, the growth pressure is from low to high, preferably, from 100 torr to 300 torr; and rotation rate is from high to low, preferably, from 1200 rpm to 600 rpm; to avoid damage to the multiple quantum-well layer, the temperature keeps stable, preferably at 900° C. to realize change from two-dimensional growth to three-dimensional mode of the P-type layer; during etching, the P-type layer forms a standard pyramid structure with rough side wall to further increase light-emitting area and improve light-emitting efficiency.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of fabricating a light-emitting diode, comprising:
   providing a substrate;
   growing over the substrate a low-temperature $Al_xGa_{1-x}N$ ($0 \leq x \leq 1$) buffer layer, an undoped gradient GaN layer, an N-type gradient GaN layer, a multiple quantum-well layer, an $Al_xGa_{1-x}N$ ($0 \leq x \leq 1$) electron blocking layer and a P-type layer;
   wherein after growth of the buffer layer, set the growth pressure from high to low and temperature and rotation rate from low to high to realize change from three-dimensional growth to two-dimensional growth of the GaN structure layer before growth of the multiple quantum-well layer by changing critical layer thickness over the substrate surface and lateral and vertical growth rate and Si is doped at position proximal to the multiple quantum-well layer to form an undoped gradient GaN layer and an N-type gradient GaN layer with gradient growth mode; during later chip fabrication, dividing the epitaxial wafer over the etched N-type platform into chip grains and immersing them in chemical solutions for wet etching; and forming an inverted pyramid structure with rough side wall over the GaN structure layer to improve light-emitting efficiency.

2. The method of claim 1, wherein during from-bottom-to-up growth of the GaN structure layer, pressure in the reaction chamber is changed from 600 torr to 100 torr and temperature and rotation rate from 700° C. to 1150° C. and from 600 rpm to 1200 rpm respectively.

3. The method of claim 1, wherein during from-bottom-to-up growth of the GaN structure layer, the pressure, rotation rate and temperature appear liner or non-linear gradual change at the same time, i.e., the GaN structure layer is formed under gradient pressure, rotation rate and temperature environment.

4. The method of claim 1, wherein during from-bottom-to-up growth of the GaN structure layer, only one or two of pressure, rotation rate and temperature appear(s) liner gradual change while other conditions keep stable.

5. The method of claim 1, wherein during from-bottom-to-up growth of the GaN structure layer, only one or two of pressure, rotation rate and temperature appear(s) non-linear gradual change while other conditions keep stable.

6. The method of claim 1, wherein during from-bottom-to-up growth of the GaN structure layer, Si is doped at position approximate to the multiple quantum-well layer to form an N-type gradient GaN layer, in which, thicknesses of the undoped gradient GaN layer and the N-type gradient GaN layer are a and b respectively, and total growth thickness of the GaN layer from three-dimensional growth to two-dimensional growth is c, wherein: $0 \leq a < c$, $0 < b \leq c$, and $a+b=c$.

7. The method of claim 1, wherein during from-bottom-to-up growth of the GaN structure layer, some GaN layers can be replaced by $Al_xGa_{1-x}N$ ($0 \leq x \leq 1$) or $Al_xIn_yGa_{1-x-y}N$ ($0 \leq x \leq 1$, $0 \leq y \leq 1$).

8. The method of claim 1, wherein during chip fabrication, etch the side wall of the epitaxial layer to form an inverted pyramid structure with rough side wall.

9. The method of claim 1, wherein the etched GaN structure layer has an inclined rough side with inclination angle of 0°-80°.

10. The method of claim 1, wherein the epitaxial growth method is expanded to the multiple quantum-well layer or/and the P-type layer.

11. A light-emitting diode (LED) comprising:
a substrate;
sequentially grown over the substrate, a low-temperature $Al_xGa_{1-x}N$ ($0 \leq x \leq 1$) buffer layer, an undoped gradient GaN layer, an N-type gradient GaN layer, a multiple quantum-well layer, an $Al_xGa_{1-x}N$ ($0 \leq x \leq 1$) electron blocking layer and a P-type layer;
wherein after growth of the buffer layer, the growth pressure is set from high to low and temperature and rotation rate from low to high to realize change from three-dimensional growth to two-dimensional growth of the GaN structure layer before growth of the multiple quantum-well layer by changing critical layer thickness over the substrate surface and lateral and vertical growth rate and Si is doped at position proximal to the multiple quantum-well layer to form an undoped gradient GaN layer and an N-type gradient GaN layer with gradient growth mode; during later chip fabrication, dividing the epitaxial wafer over the etched N-type platform into chip grains and immersing them in chemical solutions for wet etching; and forming an inverted pyramid structure with rough side wall over the GaN structure layer to improve light-emitting efficiency.

12. The LED of claim 11, wherein during from-bottom-to-up growth of the GaN structure layer, pressure in the reaction chamber is changed from 600 torr to 100 torr and temperature and rotation rate from 700° C. to 1150° C. and from 600 rpm to 1200 rpm respectively.

13. The LED of claim 11, wherein during from-bottom-to-up growth of the GaN structure layer, the pressure, rotation rate and temperature appear liner or non-linear gradual change at the same time, i.e., the GaN structure layer is formed under gradient pressure, rotation rate and temperature environment.

14. The LED of claim 11, wherein during from-bottom-to-up growth of the GaN structure layer, only one or two of pressure, rotation rate and temperature appear(s) liner gradual change while other conditions keep stable.

15. The LED of claim 11, wherein during from-bottom-to-up growth of the GaN structure layer, only one or two of pressure, rotation rate and temperature appear(s) non-linear gradual change while other conditions keep stable.

16. The LED of claim 11, wherein during from-bottom-to-up growth of the GaN structure layer, Si is doped at position approximate to the multiple quantum-well layer to form an N-type gradient GaN layer, in which, thicknesses of the undoped gradient GaN layer and the N-type gradient GaN layer are a and b respectively, and total growth thickness of the GaN layer from three-dimensional growth to two-dimensional growth is c, wherein: $0 \leq a < c$, $0 < b \leq c$, and $a+b=c$.

17. The LED of claim 11, wherein during from-bottom-to-up growth of the GaN structure layer, some GaN layers can be replaced by $Al_xGa_{1-x}N$ ($0 \leq x \leq 1$) or $Al_xIn_yGa_{1-x-y}N$ ($0 \leq x \leq 1$, $0 \leq y \leq 1$).

18. The LED of claim 11, wherein during chip fabrication, etch the side wall of the epitaxial layer to form an inverted pyramid structure with rough side wall.

19. The LED of claim 11, wherein the etched GaN structure layer has an inclined rough side with inclination angle of 0°-80°.

20. The LED of claim 11, the multiple quantum-well layer or/and the P-type layer are grown with the same growth mode as the GaN structure.

* * * * *